(12) United States Patent
Gauthier, Jr. et al.

(10) Patent No.: US 7,826,188 B2
(45) Date of Patent: Nov. 2, 2010

(54) METHODS, DESIGN STRUCTURES, AND SYSTEMS FOR CURRENT MODE LOGIC (CML) DIFFERENTIAL DRIVER ESD PROTECTION CIRCUITRY

(75) Inventors: Robert J. Gauthier, Jr., Hinesburg, VT (US); Junjun Li, Williston, VT (US); Ankit Srivastava, Champaign, IL (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 12/140,485

(22) Filed: Jun. 17, 2008

(65) Prior Publication Data
US 2009/0310267 A1    Dec. 17, 2009

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl. .................... 361/56; 361/118
(58) Field of Classification Search .......... 361/56
See application file for complete search history.

(56) References Cited
U.S. PATENT DOCUMENTS

| | | | |
|---|---|---|---|
| 6,175,482 B1* | 1/2001 | Yee et al. | 361/111 |
| 7,269,254 B2* | 9/2007 | Frey | 379/401 |
| 2002/0071230 A1* | 6/2002 | Colclaser et al. | 361/56 |
| 2006/0017503 A1* | 1/2006 | Benzer | 330/253 |
| 2007/0297105 A1* | 12/2007 | Brennan et al. | 361/56 |
| 2009/0290272 A1* | 11/2009 | Broome et al. | 361/56 |
| 2009/0296293 A1* | 12/2009 | Ker et al. | 361/56 |

* cited by examiner

*Primary Examiner*—Jared J Fureman
*Assistant Examiner*—Dharti H Patel
(74) *Attorney, Agent, or Firm*—Cantor Colburn LLP; David Cain

(57) ABSTRACT

A hardware description language (HDL) design structure encoded on a machine readable data storage medium, the HDL design comprising elements that when processed in a computer aided design system generates a machine executable representation of a device for implementing dynamic refresh protocols for DRAM based cache. The HDL design structure further comprises an integrated circuit having a differential driver, comprising: a first driver and a second driver forming the differential driver, the drivers are coupled in parallel between a first voltage source and a second voltage source; a first switch coupled to the first driver and configured to turn off the first driver during an ESD event such that the first driver sustains stress during the ESD event; and a second switch coupled to the second driver and configured to turn off the second driver during the ESD event such that the second driver sustains stress during the ESD event.

20 Claims, 3 Drawing Sheets

METHODS, DESIGN STRUCTURES, AND SYSTEMS FOR CURRENT MODE LOGIC (CML) DIFFERENTIAL DRIVER ESD PROTECTION CIRCUITRY

BACKGROUND OF THE INVENTION

1. Field of the Invention

This invention relates to systems, methods, and design structures for current mode logic differential driver ESD protection circuitry.

2. Description of Background

For high-speed differential operation in the GHz range, current mode logic (CML) drivers are typically used for their large attainable bandwidth. These are simple resistively loaded differential amplifiers.

As technology scales supply voltage, transistor threshold voltage, breakdown voltage reduces. The lower breakdown voltage of the devices makes them susceptible to the electrostatic discharge (ESD) stress. Lower threshold voltages of the transistors make them conduct large current at small overdrive voltages. This current can exceed the current limit of the salicided driver transistor, leading to failures.

Recently, driver NFETs failure was discovered in the CML driver topology during pad-to-pad or pin-to-pin electrostatic discharge (ESD) stress. It has been observed that during pad-to-pad ESD stress, one of the driver transistors of the CML driver turns on putting the entire ESD stress across its partner (the other driver transistor of the CML driver). In a CML driver structure, an ESD zap is applied at one pad and ground connection is applied to the other pad to create an ESD stress test. In operation, one of the drivers of the CML driver structure turns on discharging the current mode (CM) node of the CML driver to 0V. This puts most of the entire ESD stress on its partner. This causes drain-source short on the partner driver transistor, leading to ESD failures.

SUMMARY OF THE INVENTION

The shortcomings of the prior art are overcome and additional advantages are provided through the provision of an integrated circuit having a differential driver comprising: a first driver and a second driver forming the differential driver, the first driver and the second driver are coupled in parallel between a first voltage source and a second voltage source; a first switch coupled to the first driver, the first switch is configured to turn off the first driver during an ESD event such that the first driver sustains stress during the ESD event; and a second switch coupled to the second driver, the second switch is configured to turn off the second driver during the ESD event such that the second driver sustains stress during the ESD event, the second voltage source controls the operations of the first switch and the second switch.

The shortcomings of the prior art are overcome and additional advantages are further provided through the provision of a method of controlling a first driver and a second driver of an integrating circuit, comprising: driving a first switch coupled to the first driver during an ESD event such that the first driver sustains stress during the ESD event; and driving a second switch coupled to the second driver during the ESD event such that the second driver sustains stress during the ESD event, the first driver and the second driver form a differential driver of the integrated circuit, and the first driver and the second driver are coupled in parallel between a first voltage source and a second voltage source.

The shortcomings of the prior art are overcome and additional advantages are even further provided through the provision of a hardware description language (HDL) design structure encoded on a machine readable data storage medium, the HDL design comprising elements that when processed in a computer aided design system generates a machine executable representation of a device for implementing dynamic refresh protocols for DRAM based cache, wherein the HDL design structure further comprises an integrated circuit comprising: a first driver and a second driver forming the differential driver, the first driver and the second driver are coupled in parallel between a first voltage source and a second voltage source; a first switch coupled to the first driver, the first switch is configured to turn off the first driver during an ESD event such that the first driver sustains stress during the ESD event; and a second switch coupled to the second driver, the second switch is configured to turn off the second driver during the ESD event such that the second driver sustains stress during the ESD event, the second voltage source controls the operations of the first switch and the second switch, wherein the second voltage source is at a higher potential than the first voltage source during the ESD event.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for forming an integrated circuit having an ESD protection scheme.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompany drawings and detailed in the following description. Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

The inventors herein have recognized an electrostatic discharge (ESD) protection circuit scheme for differential driver pin-to-pin ESD stress. The inventors herein have recognized that using switches to turn off driver transistors and switches to turn-off pre-driver transistors, if any, will enhance ESD protection in differential CML drivers. The inventors have further recognized that using a voltage source (Vss) that drives the switches controlling the driver transistors and the pre-driver transistors as a signal can be used to detect an ESD stress event.

It should be understood that the structure of Positive Channel Field Effect Transistors (PFETs) and Negative Channel Field Effect Transistors (NFETs) used in exemplary embodiments of the present invention in their simplest form comprise a gate electrode over a gate dielectric over a channel region in a semiconductor substrate with a source and a drain formed in the substrate on opposite sides of the channel region. It is contemplated that other structurally complex PFETs and NFETs as known in the art may be used in exemplary embodiments of the present invention.

Figure 1:
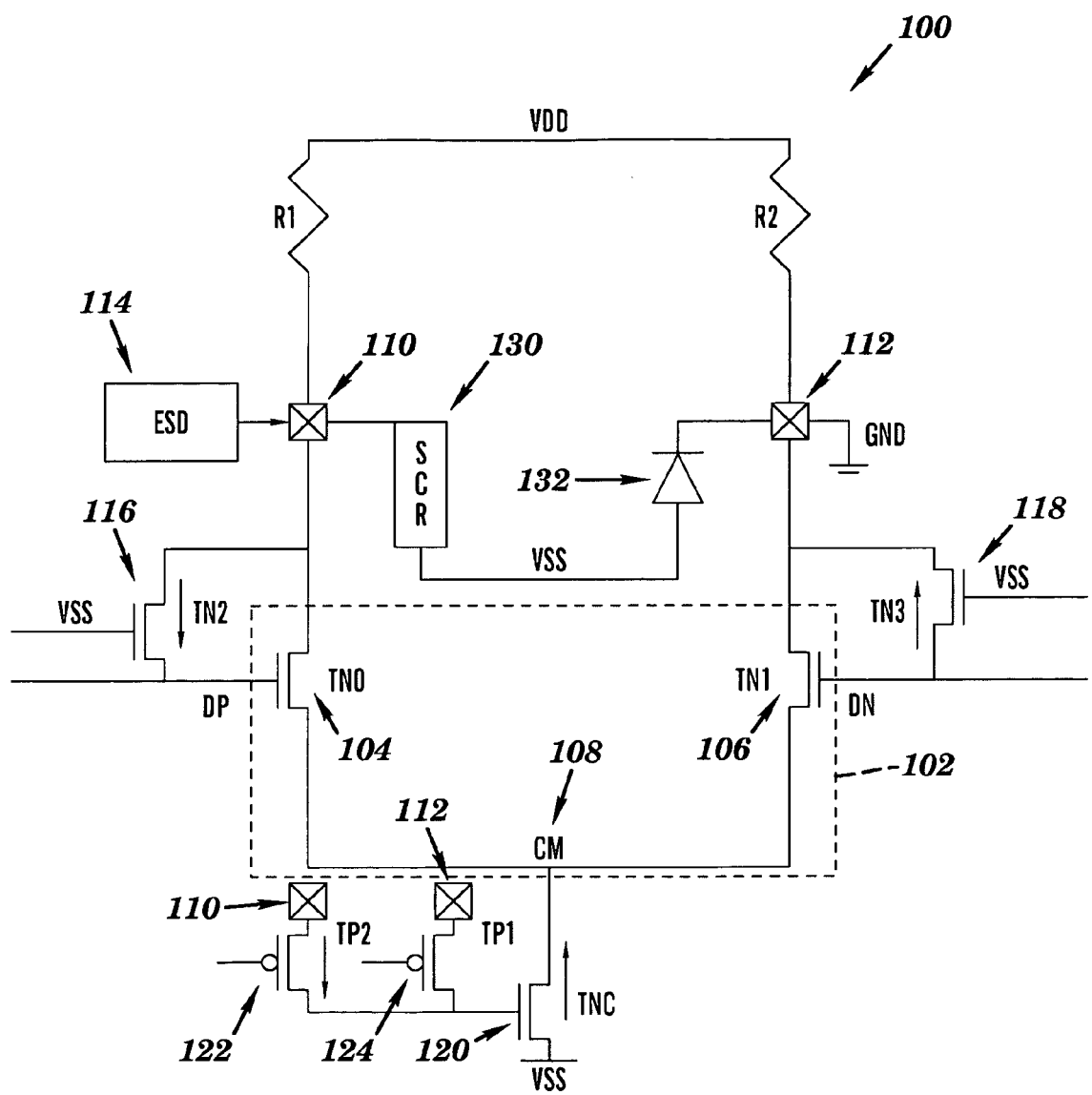
FIG. 1 is a schematic circuit diagram of an integrated circuit having an ESD protection circuitry scheme in accordance with one exemplary embodiment of the present invention.

For a better understanding of the invention and its operation, turning now to the drawings, FIG. 1 is a schematic circuit diagram of an integrated circuit 100 having current mode logic (CML) driver topology in accordance with one exemplary embodiment. The integrated circuit 100 includes a differential driver 102 comprising a first driver (TN0) 104, a second driver (TN1) 106, and a CM node 108. The first driver 104 and the second driver 106 are coupled in parallel between a first voltage source or rail ($V_{dd}$) and a second voltage source or rail ($V_{ss}$). The CM node 108 is coupled between the first driver 104 and the second driver 106. In accordance with one non-limiting exemplary embodiment, the first driver 104 and the second driver 106 are NFETs.

The integrated circuit further includes, pins 110 and 112. In accordance with one exemplary embodiment, pins 110 and 112 are correspondingly coupled to the first driver 104 and the second driver 106. In accordance with one exemplary embodiment, pin 110 is configured to receive a pulsing current or an ESD zap generated from a transmission-line pulse (TLP) generator 114, thereby creating an ESD event in the circuit that provides a pin-to-pin test on the circuit, while pin 112 is coupled to a ground (GND) (referred to as ESD event A). In one non-limiting exemplary embodiment, the TLP generator 114 generates 2 Amperes (A) ESD pulses at a pulse width of 100 nanoseconds (ns). Of course, the characteristics of the ESD zap can vary depending on the application and should not be limited to the example set forth above. It should be understood that in other exemplary embodiments, the ESD protection circuit scheme described herein can be implemented where the ESD zap from the TLP generator 114 is applied at pin 112 while pin 110 is coupled to ground (referred to as ESD event B).

The integrated circuit further includes resistors R1 and R2. In accordance with one exemplary embodiment, resistor R1 is coupled between the first voltage source ($V_{dd}$) and pin 110 and resistor R2 is coupled between the first voltage source ($V_{dd}$) and the second pin 112. The resistors R1, R2 can each include any resistive value depending on the application. In accordance with one non-limiting exemplary embodiment, the plurality of resistors each have a resistive value of about 50 ohms.

The integrated circuit 10 further includes a first switch (TN2) 116 and a second switch (TN3) 118. In one non-limiting exemplary embodiment, the switches (116, 118) are each NFETs. The first switch 116 is coupled between the first driver 104 and pin 110. Under ESD event B, the first switch 116 operably turns off the first driver 104 during an electrostatic discharge event (ESD) event such that the first driver 104 sustains stress during the ESD event. In other words, the first switch 116 protects the first driver 104 during an ESD event by turning the first driver 104 off. The second switch 118 is coupled between the second driver 106 and pin 112. Under ESD event A, the second switch 118 operably turns off the second driver 106 during an ESD event such that the second driver 106 sustains stress during the ESD event. In other words, the second switch 118 protects the second driver 106 during an ESD event by turning the second driver 106 off.

In accordance with one exemplary embodiment, the gates of the first switch 116 and the second switch 118 are controlled by the second voltage source ($V_{ss}$). During an ESD event, the second voltage source ($V_{ss}$) goes high to turn both the first switch 116 and the second switch 118 on respectively, which effectively turns off the first driver 104 and the second driver 106 respectively raising the snapback trigger voltages of the first driver 104 and the second driver 106. This reduces the voltage drop on the first driver 104 and the second driver 106, thereby preventing driver failures or damage to the drivers during an ESD event. During normal operation, the second voltage source ($V_{ss}$) is at a low potential, thereby keeping the first switch 116 and the second switch 118 off. In this case, the first driver 104 and the second driver 106 are on.

Since the second driver 106 is coupled to pin 112, as shown in FIG. 1, the gate (DN) of the second driver 106 has a higher potential than ground (GND). Thus, the second driver 106 is likely to turn on, thereby lowering the voltage drop across the second driver 106. As such, the voltage drop across the first driver 104 is higher than the voltage drop across the second driver 106. In order to evenly distribute the voltage drop between the first driver 104 and the second driver 106 such that one driver is not more stressed than the other driver during an ESD event, the potential of the CM node 108 is raised by feeding the CM node 108 with a pulsing current, which will be described in more detail below.

In accordance with one exemplary embodiment, the second voltage source ($V_{ss}$) is coupled to the CM node 108 to provide the same with pulsing current during an ESD event. When pulsing current is pumped to the CM node 108, the potential at the CM node 108 is raised and the voltage drop across the second driver 106 is increased such that the voltage drop across the second driver 106 is more even with the voltage drop across the first driver 104.

In accordance with one exemplary embodiment, a third switch (TNC) 120 is coupled between the CM node 108 and the second voltage source ($V_{ss}$). In accordance with one exemplary embodiment, a transistor device 122 (TP2) controls the third switch 120. More specifically, the transistor device 122 (TP2) selectively turns on the third switch 120 to provide a flow path between the second voltage source ($V_{ss}$) and the CM node 108 in accordance with one exemplary embodiment. In this embodiment, the transistor device 122 (TP2) is coupled to the first voltage source ($V_{dd}$) and pin 110 as shown. In other exemplary embodiments of the present invention where pin 112 receives ESD pulses from the TLP generator 114 while pin 110 is coupled to ground, a transistor device 124 (TP1) controls the third switch 120. In this embodiment, the transistor device 124 (TP1) is coupled to the first voltage source ($V_{dd}$) and pin 112. However, for simplistic purposes, details of the ESD protection circuit scheme described herein will only be described with transistor device 122 (TP2) controlling the third switch 120. As shown, the first switch 116 and the transistor device 124 (TP1) are included in the circuit for symmetry. These devices take the role of the second switch 118 and the transistor device 122 (TP2) respectively when the ESD zap is applied to pin 112 rather than pin 110.

In accordance with one exemplary embodiment, transistor device 122 (TP2) is a PMOS transistor whose gate and body is softly tied or connected to the first voltage source ($V_{dd}$) and effectively to the TLP generator 114 (source to pin 110). During an ESD event, pin 110 is the largest potential in the circuit and the voltage of first voltage source ($V_{dd}$) is less than the voltage at pin 110. This effectively turns on transistor device 122 (TP2) to charge the gate of the third switch 120. Thus, the potential at the CM node 108 is raised so as to evenly distribute the voltage drop across the first driver 104 and the second driver 106.

In accordance with one exemplary embodiment, one or more ESD protection devices are serially coupled between pin 110 and pin 112 for controlling the current flow between the pins (110, 112) during an ESD event. For example, a silicon-control rectifier (SCR) 130 and a diode 132 are serially coupled between pin 110 and pin 112 to control the current flow therebetween. Of course, other ESD protection devices can be implemented in the exemplary embodiments described herein and should not be limited to the examples described above. As shown, the second voltage source (Vss) is serially coupled between the SCR 130 and the diode 132 in accordance with one exemplary embodiment.

Turning now to an example of the ESD protection circuit scheme and a method of providing the same. In operation, an ESD event is created by injecting pin 110 with an ESD zap from TLC generator 114. Current flows through the SCR (130) and the diode 132 to the ground terminal. In one example, the SCR 130 has a holding voltage of 1.0 volts (V) and the on resistance of 0.5 ohm. This leads to a about 2V across the SCR 130. In this example, the diode has a holding voltage of 0.7 V and the on resistance of 0.5 ohm. This leads to about 1.4 V across the diode 132. This 1.4 V is also the potential of the second voltage source (Vss) (includes on-chip local ground). As such, the total voltage on pin 110 is about 3.4 V. Thus, when an ESD event is created between the pins (110, 112), the second voltage source (Vss) is raised to about 1.4 V. With this exemplary configuration, the second voltage source (Vss) can be used to detect the ESD event. In addition, the second voltage source (Vss) can be used to effectively manipulate the state of the first driver 104 and the second driver 106 to sustain stress during an ESD event as described above.

Figure 2:
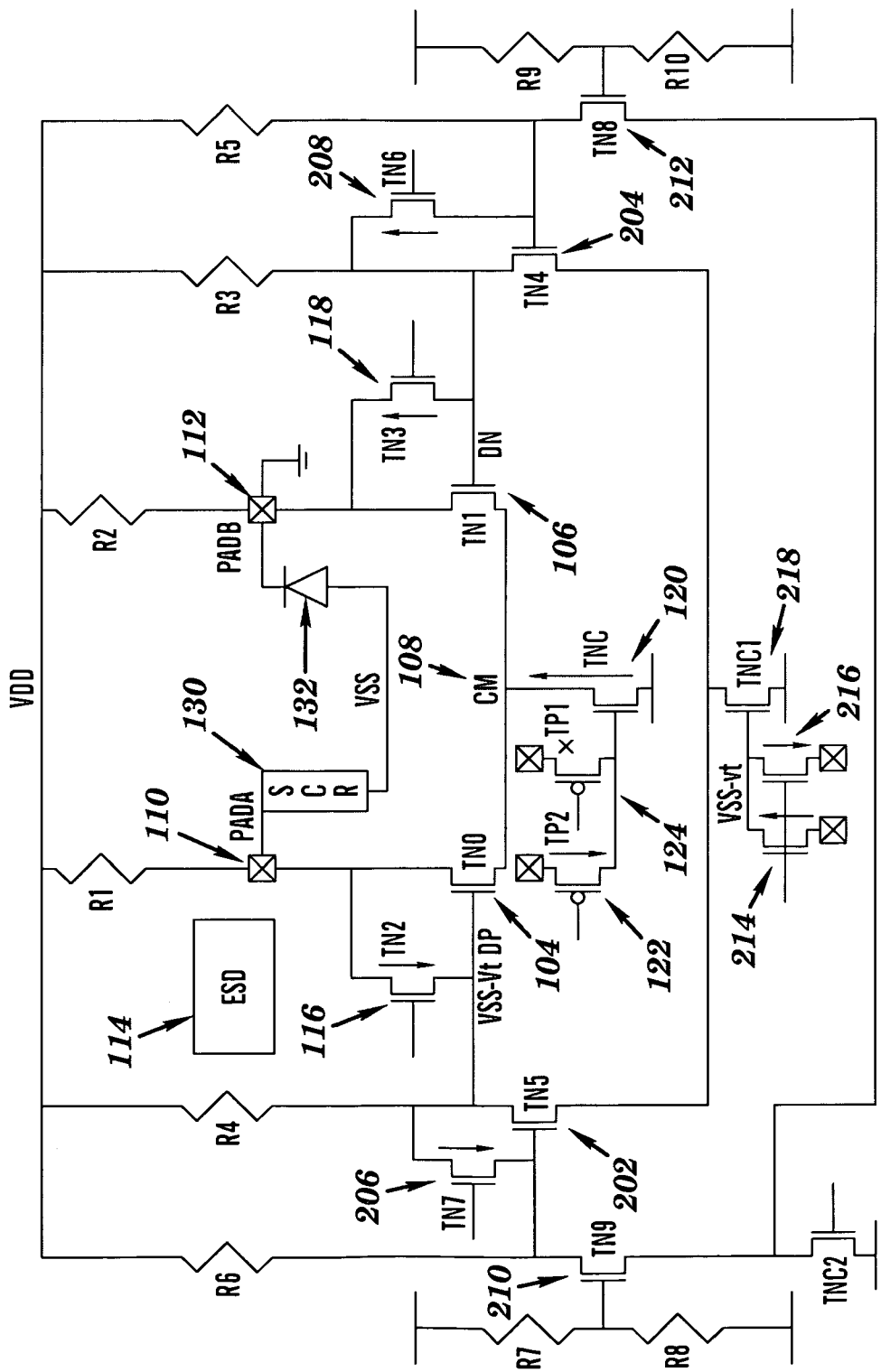
FIG. 2 is another schematic circuit diagram of an integrated circuit having an ESD protection circuitry scheme in accordance with one exemplary embodiment of the present invention.

FIG. 2 is a schematic circuit diagram of another integrated circuit 200 in accordance with one exemplary embodiment of the present invention. This embodiment is a modification of the integrated circuit shown in FIG. 1. In this embodiment, pre-drivers are integrated in circuit 100 to drive the first driver 104 and the second driver 106. More specifically, a first pre-driver (TN5) 202 and a second pre-driver (TN4) 204 are integrated to circuit 100 to drive the first driver 104 and the second driver 106 respectively. In one non-limiting exemplary embodiment, the pre-drivers 202, 204 are NMOS transistors. As will be apparent with the discussion below, the ESD protection circuit protection scheme can be co-designed to work for the circuits in FIGS. 1 and 2.

The pre-drivers (202, 204) are added to tackle circuit operating speed requirements. The integrated circuit 200 also integrates a first pre-driver switch (TN7) 206 and a second pre-driver switch (TN6) 208 to circuit 100 for turning the first pre-driver 202 and the second pre-driver 204 off during an ESD event in a similar fashion as described for the circuit in FIG. 1. In one non-limiting exemplary embodiment, the pre-driver switches 206, 208 are NMOS transistors.

This embodiment also integrates a plurality of resistors R3-R10 and transistor devices 210, 212, 214, and 216 to circuit 100 as shown. Each of the plurality of resistors R3-R10 can include any resistive value depending on the application. In accordance with one non-limiting exemplary embodiment, each of the plurality of resistors have a resistive value of about one kilo ohm. The integrated circuit 200 further includes a fourth switch (TNC1) 218 coupled to the second pre-driver 204 and the second voltage source ($V_{ss}$). In one non-limiting exemplary embodiment, the fourth switch 218 is an NMOS transistor. In accordance with one exemplary embodiment, the transistor device 214 coupled to the second voltage source ($V_{ss}$) and pin 110 controls the fourth switch 218. More specifically, transistor device 214 selectively turns on the fourth switch 218 to provide a flow path between second voltage source ($V_{ss}$) and the second pre-driver 204. When the fourth switch 218 is turned on, the second voltage source ($V_{ss}$) provides the same with current. In other exemplary embodiments of the present invention where the ESD zap is applied to pin 112 while pin 110 is coupled to ground, transistor device 216 controls the fourth switch 218. In this embodiment, the transistor device 216 is coupled to the second voltage source ($V_{ss}$) and pin 112.

In the embodiment shown in FIG. 2, when an ESD zap from the TLP generator 114 is applied to pin 110, the second voltage source ($V_{ss}$) potential rises. The second switch 118 turns on to short the gate (DN) of the second driver 106 and pin 112. Also, the first switch 116 turns on to raise the potential of the gate (DP) of the first driver 104 to $V_{ss}$-$V_t$. DN and DP find a low resistance path through the pre-drivers (202, 204). This raises the potential of DN. Due to ESD at pin 110 and ground at pin 112, the first voltage source ($V_{dd}$) gets charged to half the voltage of pin 110 (~1.7V). The first voltage source ($V_{dd}$) then charges DN through resistor R3. The gate of the fourth switch 218 is between $V_{ss}$ and $V_{dd}$. This charges DN accordingly. These effects cause the second driver 106 to be slightly on. Although the size of the second switch 118 can be increased to turn the second driver 106 off more strongly, the size of second switch 118 is determined such that it does add capacitive loading during normal operation. In this case, the second driver 106 is operating at a relatively lower speed. As such, the size of the second switch 118 can be increased.

If the size of the first switch 116 and the second switch 118 can not be increased due to speed constraints, the pre-driver switches (206, 208) are implemented to turn the pre-drivers (202, 204) off, which were shorting DP and DN. The pre-driver switches 206 and 208 find a short current path through transistor devices 210 and 212 respectively. In accordance with one exemplary embodiment, the sizes of transistor devices 210 and 212 are less than the sizes of pre-driver 202 and 204. The sizes of pre-drivers (202, 204) are large such that they drive drivers (104, 106), which are sized to drive the 50 ohms transmission line.

In accordance with one exemplary embodiment, the current source of the fourth switch 218 is turned off by pulling the gate of the fourth switch 218 towards pin 112, which is grounded. The gates of transistors devices 214 and 216 are coupled to the second voltage source ($V_{ss}$) so during an ESD event the transistor devices 214 and 216 turn on and discharge the gate of the fourth switch 218 to zero. Although one of these transistor devices tries to charge the gate of the fourth switch 218, the fourth switch 218 charges up to $V_{ss}$-$V_t$ so some current flows in the direction as shown. During normal operation, these transistor devices are turned off since their gate is control by the second voltage source ($V_{ss}$), which is at 0V during normal operation. In this configuration, there is no net coupling effect between the transistor devices.

Figure 3:
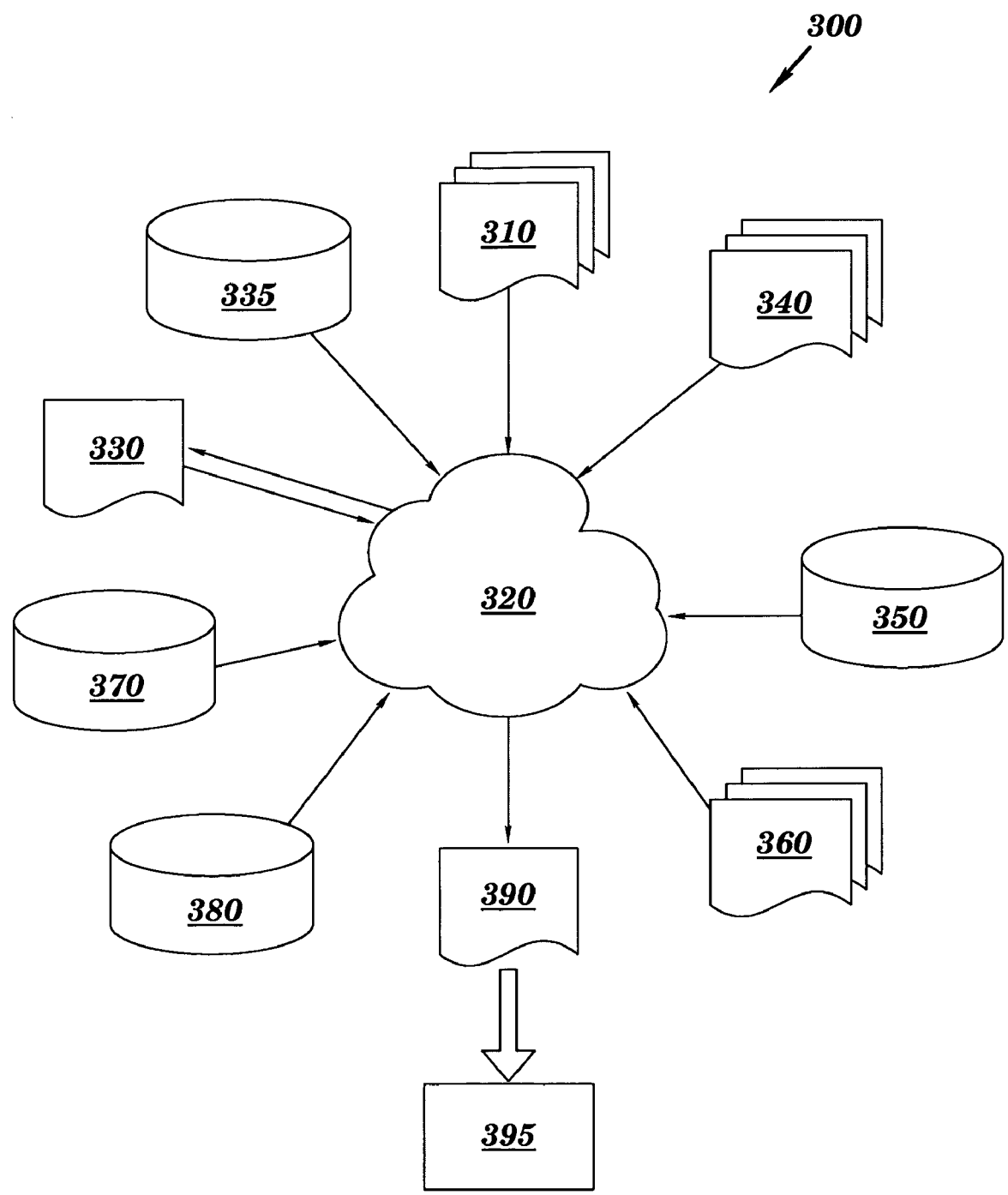
FIG. 3 illustrates a flow diagram of a design process used in semiconductor design, manufacture, and/or test.

FIG. 3 shows a block diagram of an exemplary design flow 300 used for example, in semiconductor IC logic design, simulation, test, layout, and manufacture. Design flow 300 includes processes and mechanisms for processing design structures or devices to generate logically or otherwise functionally equivalent representations of the design structures and/or devices described above and shown in FIGS. 1 and 2. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 310 that is preferably processed by a design process 320. Design structure 310 may be a logical simulation design structure generated and processed by design process 320 to produce a logically equivalent functional representation of a hardware device. Design structure 310 may also or alternatively comprise data and/or program instructions that when processed by design process 320, generate a functional representation of the physical structure of a hardware device. Whether representing functional and/or structural design features, design structure 310 may be generated using electronic computer-aided design (ECAD) such as implemented by a core developer/designer. When encoded on a machine-readable data transmission, gate array, or storage medium, design structure 310 may be accessed and processed by one or more hardware and/or software modules within design process 320 to simulate or otherwise functionally represent an electronic component, circuit, electronic or logic module, apparatus, device, or system such as those shown in FIGS. 1 and 2. As such, design structure 310 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 320 preferably employs and incorporates hardware and/or software modules for synthesizing, translating, or otherwise processing a design/simulation functional equivalent of the components, circuits, devices, or logic structures shown in FIGS. 1 and 2 to generate a netlist 330 which may contain design structures such as design structure 310. Netlist 330 may comprise, for example, compiled or otherwise processed data structures representing a list of wires, discrete components, logic gates, control circuits, I/O devices, models, etc. that describes the connections to other elements and circuits in an integrated circuit design. Netlist 330 may be synthesized using an iterative process in which netlist 330 is resynthesized one or more times depending on design specifications and parameters for the device. As with other design structure types described herein, netlist 330 may be recorded on a machine-readable data storage medium 315 or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 320 may include hardware and software modules for processing a variety of input data structure types including netlist 330. Such data structure types may reside, for example, within library elements 335 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 380 which may include input test patterns, output test results, and other testing information. Design process 320 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 320 without deviating from the scope and spirit of the invention. Design process 320 may also include modules for performing standard circuit design processes such as timing analysis, verification, design rule checking, place and route operations, etc.

Design process 320 employs and incorporates logic and physical design tools such as HDL compilers and simulation model build tools to process design structure 310 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 310, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 390 may comprise a compiled, executable HDL simulation model that functionally simulates the devices shown in FIGS. 1 and 2.

Design structure 390 may also employ a data format used for the exchange of layout data of integrated circuits and/or symbolic data format (e.g., information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 390 may then proceed to a stage 395 where, for example, design structure 390: proceeds to tape-out, is released to manufacturing, is released to a mask house, is sent to another design house, is sent back to the customer, etc.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An integrated circuit having a differential driver, the integrated circuit comprising:
    a first driver and a second driver forming the differential driver, the first driver and the second driver are coupled in parallel between a first voltage source and a second voltage source;
    a first switch coupled to the first driver, the first switch is configured to turn off the first driver during an ESD event such that the first driver sustains stress during the ESD event; and
    a second switch coupled to the second driver, the second switch is configured to turn off the second driver during the ESD event such that the second driver sustains stress during the ESD event, the second voltage source controls the operations of the first switch and the second switch.

2. The integrated circuit as in claim 1, wherein the second voltage source is at a lower potential than the first voltage source during normal operation, the second voltage source being used to detect the ESD event.

3. The integrated circuit as in claim 1, wherein the first driver and the second driver are correspondingly coupled to a first pin and a second pin of the integrated circuit, the first pin is configured to receive a pulsing current during the ESD event, wherein the second pin is coupled to a ground.

4. The integrated circuit as in claim 3, wherein one or more ESD protection devices are serially coupled between the first pin and the second pin for controlling current flow from the first pin to the second pin during the ESD event.

5. The integrated circuit as in claim 3, wherein the pulsing current applied to the first pin enables the first and second switch to correspondingly turn off the first driver and the second driver during the ESD event raising the snapback trigger voltages of the first driver and the second driver respectively.

6. The integrated circuit as in claim 3, wherein the pulsing current applied to the first pin enables a third switch to permit the second voltage source to pump current to a first node coupled between the first driver and the second driver, the potential of the first node is raised by the pulsing current so as to evenly distribute the voltage drop across the first driver and the second driver.

7. The integrated circuit as in claim 6, wherein the third switch is coupled between the first node and the second voltage source, the third switch acting as a current source transistor in normal operation.

8. The integrated circuit as in claim 7, wherein a transistor device controls the third switch, the transistor device being coupled to the first voltage source and the first pin.

9. The integrated circuit as in claim 1, wherein the integrated circuit further comprises: a first pre-driver and a second pre-driver correspondingly coupled to the first driver and the second driver for correspondingly driving the first driver and the second driver.

10. The integrated circuit as in claim 9, wherein the integrated circuit further comprises:
    a fourth switch coupled to the first pre-driver, the fourth switch is configured to turn off the first pre-driver during the ESD event such that the first driver sustains stress during the ESD event; and
    a fifth switch coupled to the second pre-driver, the fifth switch is configured to turn off the second pre-driver during the ESD event such that the first driver sustains stress during the ESD event, wherein the second voltage source controls the operations of the fourth switch and the fifth switch.

11. A method of controlling a first driver and a second driver of an integrating circuit, comprising:
    driving a first switch coupled to the first driver during an ESD event such that the first driver sustains stress during the ESD event; and
    driving a second switch coupled to the second driver during the ESD event such that the second driver sustains stress during the ESD event, the first driver and the second driver form a differential driver of the integrated circuit, and the first driver and the second driver are coupled in parallel between a first voltage source and a second voltage source.

12. The method as in claim 11, wherein the second voltage source controls the operations of the first switch and the second switch, the second voltage source is at a higher potential than the first voltage source during an ESD event, the second voltage source is at a lower potential than the first voltage source during normal operation, and the second voltage source is used to detect the ESD event.

13. The method as in claim 11, wherein the first driver and the second driver are correspondingly coupled to a first pin and a second pin of the integrated circuit, the first pin is configured to receive a pulsing current during the ESD event, wherein the second pin is coupled to a ground.

14. The integrated circuit as in claim 13, wherein one or more ESD protection devices are serially coupled between the first pin and the second pin for controlling current flow from the first pin to the second pin during the ESD event.

15. The integrated circuit as in claim 13, wherein the pulsing current applied to the first pin enables the first and second switch to correspondingly turn off the first driver and the second driver during the ESD event raising the snapback trigger voltages of the first driver and the second driver respectively.

16. The integrated circuit as in claim 13, wherein the pulsing current applied to the first pin enables a third switch to permit the second voltage source to pump current to a first node coupled between the first driver and the second driver, the potential of the first node is raised by the pulsing current so as to evenly distribute the voltage drop across the first driver and the second driver.

17. A hardware description language (HDL) design structure encoded on a non-transitory machine readable data storage medium, the HDL design comprising elements that when processed in a computer aided design system generates a machine executable representation of a device for implementing dynamic refresh protocols for DRAM based cache, wherein the HDL design structure further comprises:
  an integrated circuit having a differential driver, the integrated circuit comprising:
    a first driver and a second driver forming the differential driver, the first driver and the second driver are coupled in parallel between a first voltage source and a second voltage source;
    a first switch coupled to the first driver, the first switch is configured to turn off the first driver during an ESD event such that the first driver sustains stress during the ESD event; and
    a second switch coupled to the second driver, the second switch is configured to turn off the second driver during the ESD event such that the second driver sustains stress during the ESD event, the second voltage source controls the operations of the first switch and the second switch.

18. The design structure of claim 17, wherein the design structure comprises a netlist.

19. The design structure of claim 17, wherein the design structure resides on storage medium as a data format used the exchange of layout data of integrated circuits.

20. The design structure of claim 17, wherein the design structure resides in a programmable gate array.

* * * * *